(12) United States Patent
Mita et al.

(10) Patent No.: US 11,948,907 B2
(45) Date of Patent: Apr. 2, 2024

(54) LAMINATE

(71) Applicant: NITTO DENKO CORPORATION, Ibaraki (JP)

(72) Inventors: Ryota Mita, Ibaraki (JP); Tomoaki Ichikawa, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 79 days.

(21) Appl. No.: 17/360,144

(22) Filed: Jun. 28, 2021

(65) Prior Publication Data

US 2021/0407952 A1    Dec. 30, 2021

(30) Foreign Application Priority Data

Jun. 29, 2020  (JP) .................. 2020-111570

(51) Int. Cl.
*H01L 23/00*   (2006.01)

(52) U.S. Cl.
CPC .............. *H01L 24/29* (2013.01); *H01L 24/32* (2013.01); *H01L 2224/2929* (2013.01); *H01L 2224/29339* (2013.01); *H01L 2224/29347* (2013.01); *H01L 2224/29386* (2013.01); *H01L 2224/32245* (2013.01); *H01L 2224/83986* (2013.01)

(58) Field of Classification Search
None
See application file for complete search history.

(56) References Cited

U.S. PATENT DOCUMENTS

| | | | |
|---|---|---|---|
| 2017/0194169 A1 | 7/2017 | Schafer et al. | |
| 2018/0264489 A1* | 9/2018 | Tsuchibuchi | B32B 27/00 |
| 2019/0217587 A1 | 7/2019 | Sawamoto et al. | |
| 2019/0311936 A1 | 10/2019 | Honda et al. | |
| 2020/0277515 A1 | 9/2020 | Ichikawa et al. | |
| 2020/0291273 A1* | 9/2020 | Kwon | H01B 1/24 |

FOREIGN PATENT DOCUMENTS

| | | |
|---|---|---|
| EP | 3476592 A1 | 5/2019 |
| EP | 3477689 A1 | 5/2019 |
| EP | 3667707 A1 | 6/2020 |
| JP | 2013-039580 A | 2/2013 |
| JP | 2014-503936 A | 2/2014 |
| JP | 2014-111800 A | 6/2014 |
| JP | 2017-520907 A | 7/2017 |
| WO | 2019021814 A1 | 1/2019 |

OTHER PUBLICATIONS

Extended (Supplementary) European Search Report dated Oct. 25, 2021, issued in counterpart EP Application No. 21182173.1. (6 pages).
Office Action dated Feb. 2, 2024, issued in counterpart JP application No. 2002-111570 with English Machine Translation. (8 pages).

* cited by examiner

*Primary Examiner* — Seth Dumbris
(74) *Attorney, Agent, or Firm* — WHDA, LLP

(57) ABSTRACT

The present invention is a laminate including a base sheet and a metal particle-containing layer laminated on the base sheet, and including metal particles. The base sheet has a contact surface in contact with the metal particle-containing layer, and a Young's modulus of the base sheet at 23° C., which is obtained by measuring the contact surface using a nano-indentation method, is 0.01 to 10 GPa.

6 Claims, 3 Drawing Sheets

LAMINATE

CROSS-REFERENCE TO RELATED APPLICATION

This application claims priority to Japanese Patent Application No. 2020-111570, the disclosure of which is incorporated herein by reference in its entirety.

FIELD

The present invention relates to a laminate.

BACKGROUND

Pasty compositions including metal particles are conventionally used for adhering a semiconductor chip (hereinafter also referred to as "die") to a lead frame or the like in the production of semiconductor devices, as disclosed in, for example, JP 2013-039580 A and JP 2014-111800 A. Also, there is known a method for forming the pasty compositions into a film, transferring a part of the film to a die to allow the die to be adhered to a lead frame or the like via the film, as disclosed in, for example, JP 2014-503936 T.

SUMMARY

Technical Problem

However, there may be cases where the film is not sufficiently transferred to an adherend (such as a die), which prevents the adherend and a lead frame or the like from being sufficiently adhered to each other.

In view of the aforementioned problem, it is an object of the present invention to provide a laminate excellent in transferability.

Solution to Problem

A laminate according to the present invention includes a base sheet and a metal particle-containing layer that is laminated on the base sheet and includes metal particles, wherein the base sheet has a contact surface in contact with the metal particle-containing layer, and a Young's modulus at 23° C. of the base sheet, which is obtained by measuring the contact surface using a nano-indentation method, is 0.01 to 10 GPa.

DESCRIPTION OF EMBODIMENTS

Hereinafter, an embodiment of the present invention will be described by taking, for example, the case where a metal particle-containing layer of a laminate according to this embodiment is a sinterable layer, with reference to the attached drawings. The metal particle-containing layer of the laminate according to this embodiment is a layer adhered to an adherend by sintering for use.

Figure 1:
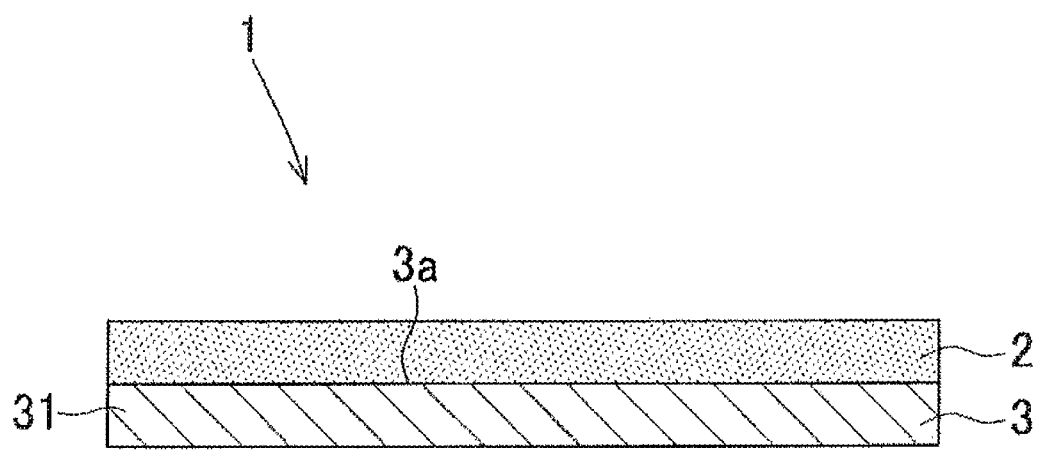
FIG. 1 is a schematic sectional view of a laminate according to this embodiment.

As shown in FIG. 1, the laminate 1 according to this embodiment includes a base sheet 3 and a metal particle-containing layer 2 that is laminated on the base sheet 3 and includes metal particles. The base sheet 3 is a resin layer 31 including a resin. Also, the base sheet 3 has a contact surface 3a in contact with the metal particle-containing layer 2. Specifically, the resin layer 31 has a contact surface 3a in contact with the metal particle-containing layer 2.

The metal particle-containing layer 2 is laminated on the base sheet 3 so as to be releasable from the base sheet 3. The laminate 1 according to this embodiment is configured such that a part of the metal particle-containing layer 2 is pressed toward the base sheet 3 to be cut out, and the cut-out part of the metal particle-containing layer 2 is released from the base sheet 3 and adhered to an adherend (for example, a die) for use. More specifically, the laminate 1 according to this embodiment is configured such that a part of the metal particle-containing layer 2 is pressed to be cut out for use by a press member that presses the metal particle-containing layer 2 toward the base sheet 3, and the cut-out part of the metal particle-containing layer 2 is released from the base sheet 3 and adhered to an adherend (for example, a die).

Examples of the resin included in the resin layer 31 include a polyolefin resin, a polyester resin, a polyurethane resin, a polycarbonate resin, a polyetheretherketone resin, a polyimide resin, a polyetherimide resin, a polyamide resin, polyvinyl chloride, polyvinylidene chloride, a polyphenyl sulfide resin, a fluorine resin, a cellulose-based resin, and a silicone resin. The resin may be an ionomer resin. Examples of the polyolefin resin include a low density polyethylene, a linear low density polyethylene, a medium density polyethylene, a high density polyethylene, an ultralow density polyethylene, a random copolymer polypropylene, a block copolymer polypropylene, a homo polypropylene, polybutene, polymethylpentene, an ethylene vinyl acetate copolymer, an ethylene-(meth)acrylic acid copolymer, an ethylene-(meth)acrylic acid ester copolymer, an ethylene-butene copolymer, and an ethylene-hexene copolymer. Examples of the polyester resin include polyethylene terephthalate (PET), polyethylene naphthalate, and polybutylene terephthalate. Examples of the polyamide resin include a wholly aromatic polyamide (aramid). Examples of the fluorine resin include polytetrafluoroethylene (PTFE).

The resin layer 31 may be formed of a film. The film maybe a uniaxially-stretched film or a biaxially-stretched film. The resin layer 31 may be a porous body.

It is important that a Young's modulus at 23° C. of the base sheet 3, which is obtained by measuring the contact surface 3a using a nano-indentation method, is 0.01 to 10 GPa, preferably 0.02 to 8 GPa, more preferably 0.1 to 5 GPa, particularly preferably 0.3 to 3.4 GPa. In other words, it is important that the base sheet 3 has a Young's modulus at 23° C., which is obtained by measuring the contact surface 3a using a nano-indentation method, of 0.01 to 10 GPa, preferably 0.02 to 8 GPa, more preferably 0.1 to 5 GPa, particularly preferably 0.3 to 3.4 GPa. The laminate 1 according to this embodiment having a Young's modulus of 10 GPa or less has an advantage that, when an adherend (for example, a die) is pressed on the metal particle-containing layer 2, a force tends to be applied to the entire metal particle-containing layer 2 that is in contact with the adherend, with the result that the metal particle-containing layer 2 can be sufficiently transferred to the adherend. Also, the laminate 1 according to this embodiment having a Young's modulus of 0.01 GPa or more has an advantage that, when an adherend (for example, a die) is pressed on the metal particle-containing layer 2, a sufficient force tends to be applied in a direction in which the adherend is pressed, with the result that the metal particle-containing layer 2 can be sufficiently transferred to the adherend.

The Young's modulus can be obtained by the nano-indentation method according to ISO 14577 (instrumented indentation test). Specifically, the measurement can be performed using a micro hardness tester (DUH-211 manufactured by Shimadzu Corporation) in the following conditions.

Indenter: Berkovich indenter
Test mode: Loading-unloading test
Test force: 0.98 mN
Minimum test force: 0.002 mN
Loading speed/unloading speed: 1.0 mN/sec
Loading retention time: 5.0 sec
Unloading retention time: 5.0 sec
Cf-Ap correction adopted The nano-indentation method is a method for measuring various physical properties of a sample by a nanometer scale. In the nano-indentation method, at least a step of pressing an indenter on the sample set on a stage (load application step) and a step of subsequently pulling out the indenter from the sample (unloading step) are performed to measure the load acting between the indenter and the sample and measure the relative displacement of the indenter with respect to the sample during the series of steps. As a result, a load-displacement curve can be obtained. Physical properties (such as a hardness, an elastic modulus, or an adhesive force) of the sample on the basis of the nanometer scale measurement can be obtained from the load-displacement curve.

A total thickness of the resin layer 31 is preferably 10 to 5,000 μm, more preferably 20 to 4,000 μm, still more preferably 30 to 3,000 μm. The laminate 1 according to this embodiment has an advantage of being excellent in handleability because of a total thickness of the resin layer 31 being 10 μm or more. Also, the laminate 1 according to this embodiment has an advantage of suppressing the material cost because of a total thickness of the resin layer 31 being 5,000 μm or less.

In this embodiment, the layer thickness can be measured by a dial gauge.

The metal particle-containing layer 2 includes metal particles and a binder. Further, the metal particle-containing layer 2 may include a plasticizer or the like. The binder includes a high molecular binder and a binder other than the high molecular binder (hereinafter also referred to as "low molecular binder"). The metal particle-containing layer 2 is a sinterable layer. The sinterable layer is a layer that can be sintered by heating.

The metal particles are sinterable metal particles. Also, the metal particles are electrically conductive metal particles. The metal particle-containing layer 2 has one side and the other side that both serve as adhesion surfaces to be adhered to adherends respectively and are used for allowing the adherends to be electrically connected to each other.

Examples of the metal particles include gold, silver, copper, palladium, tin, nickel, and an alloy of these metals. Examples of the metal particles also include metal oxide. Examples of the metal oxide include silver oxide, copper oxide, palladium oxide, and tin oxide. The metal particles may be particles having a core-shell structure. Examples of the particles having the core-shell structure include particles including a core formed of copper and a shell that covers the core and is formed of gold, silver, or the like. Because the metal particle-containing layer 2 can be a sintered layer to be firmly adhered to the adhered after sintering, the metal particles preferably include at least one kind of metal selected from the group consisting of silver, copper, silver oxide, and copper oxide. Because the metal particle-containing layer 2 can be excellent in electrical conductivity and heat conductivity, the metal particles preferably include at least one kind of metal selected from the group consisting of silver and copper. In view of oxidation resistance, the metal particles preferably include silver particles. The silver particles are hard to be oxidized even by being sintered under air atmosphere. The metal particles are included in the metal particle-containing layer 2 as primary particles or secondary particles formed by aggregation of a plurality of primary particles.

In order to easily secure the flatness of a surface of the metal particle-containing layer 2, a median diameter (D50) of the metal particles on a volume basis is preferably 10,000 nm or less, more preferably 3,000 nm or less, still more preferably 1,000 nm or less, particularly preferably 500 nm or less. Also in order to improve the dispersity of metal particles in the metal particle-containing layer 2, a median diameter (D50) of the metal particles on a volume basis is preferably 1 nm or more, more preferably 10 nm or more, still more preferably 50 nm or more. The median diameter (D50) of the metal particles on a volume basis is obtained using a scanning electron microscope (SEM). That is, an area of each of the metal particles as viewed from one direction is measured by the scanning electron microscope (SEM). Next, a diameter and a volume of each of the metal particles are determined on the assumption that each of the metal particles is spherical. In the case where the metal particles are formed by the secondary particles, the diameter and the volume of the secondary particles are determined. Then, a particle size distribution on a volume basis is obtained from the data of the diameter and volume of each of the metal particles, and a median diameter (D50) of the metal particles on a volume basis is obtained from the particle size distribution on a volume basis.

The high molecular binder is preferably a thermally-degradable high molecular binder. The thermally-degradable high molecular binder is a binder thermally degraded at a sintering temperature. The thermally-degradable high molecular binder is an element to maintain the shape of the metal particle-containing layer 2 until sintering is completed. In this embodiment, the thermally-degradable high molecular binder is preferably in a solid form at normal temperature (23° C.) in order to easily maintain the shape of the metal particle-containing layer 2. Examples of such a thermally-degradable high molecular binder includes a polycarbonate resin and an acrylic resin.

Examples of the polycarbonate resin include an aliphatic polycarbonate and an aromatic polycarbonate. The aromatic polycarbonate has a benzene ring between the carbonate ester groups (—O—CO—O—) of the main chain. The aliphatic polycarbonate has an aliphatic chain with no benzene ring between the carbonate ester groups (—O—CO—O—) of the main chain. Examples of the aliphatic polycarbonate include polyethylene carbonate and polypropyrene carbonate. Examples of the aromatic polycarbonate include polycarbonate having a bisphenol-A structure in the main chain.

The acrylic resin has a (meth)acrylic acid ester as a constituent unit. Examples of the (meth)acrylic acid ester include a linear or branched (meth)acrylic acid ester having a 4-18C alkyl group. Examples of the alkyl group include a methyl group, an ethyl group, a propyl group, an isopropyl group, an n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, an undecyl group, a lauryl group, a tridecyl group, a tetradecyl group, a stearyl group, and an octadecyl group.

The acrylic resin may have a monomer other than the (meth)acrylic acid ester as a constituent unit. Examples of the monomer other than the (meth)acrylic acid ester include a carboxy group-containing monomer, an acid anhydride monomer, a hydroxy group-containing monomer, a sulfonic acid group-containing monomer, and a phosphate group-containing monomer.

Examples of the carboxy group-containing monomer include acrylic acid, methacrylic acid, carboxyethyl(meth) acrylate, carboxypentyl(meth)acrylate, itaconic acid, maleic acid, fumaric acid, and crotonic acid. Examples of the acid anhydride monomer include maleic anhydride and itaconic anhydride. Examples of the hydroxy group-containing monomer include 2-hydroxyethyl(meth)acrylic acid, 2-hydroxypropyl(meth)acrylic acid, 4-hydroxybutyl(meth) acrylic acid, 6-hydroxyhexyl(meth)acrylic acid, 8-hydroxyoctyl(meth)acrylic acid, 10-hydroxydecyl(meth) acrylic acid, 12-hydroxylauryl(meth)acrylic acid, and 4-(hydroxymethyl)cyclohexylmethyl(meth)acrylic acid. Examples of the sulfonic acid group-containing monomer include styrenesulfonic acid, arylsulfonic acid, 2-(meth) acrylamide-2-methylpropanesulfonic acid, (meth)acrylamidepropanesulfonic acid, sulfopropyl(meth)acrylate, and (meth)acryloyloxynaphthalenesulfonic acid. Examples of the phosphate group-containing monomer include 2-hydroxyethyl acryloyl phosphate.

In this embodiment, "(meth)acrylic" herein means a concept including acrylic and methacrylic. Also, "(meth)acrylate" herein means a concept including acrylate and methacrylate.

A weight-average molecular weight of the high molecular binder is preferably 10,000 or more. The weight-average molecular weight herein means a value measured by a gel permeation chromatography (GPC) and converted in terms of polystyrene. For example, the weight-average molecular weight can be obtained as a value converted in terms of polystyrene by calculation from the result of GPC measurement at a column temperature of 40° C. and a flow rate of 0.5 ml/min, using: as an apparatus, GPC "HLC-8320GPC" manufactured by Tosoh Corporation; as columns, three columns in total of "TSK guardcolumn $H_{HR}$ (S)" manufactured by Tosoh Corporation, "TSK GMH$_{HR}$-H (S)" manufactured by Tosoh Corporation, and "TSK GMH$_{HR}$-H (S)" manufactured by Tosoh Corporation, which are connected in series; as a reference column, "TSK gel Super H-RC"; and, as an eluent, tetrahydrofuran.

The low molecular binder preferably includes a low boiling point binder having a boiling point lower than the initial temperature of thermal decomposition of the thermally-degradable high molecular binder. The low molecular binder is preferably in a liquid or semi-liquid form at 23° C. Further, the low molecular binder preferably has a viscosity of $1 \times 10^5$ Pa·s at 23° C. The viscosity can be measured by a dynamic viscoelasticity measurement instrument (product name "HAAKE MARS III" manufactured by Thermo Fisher Scientific). The measurement herein is performed by using parallel plates of 20 mmφ as a jig, setting a gap between the plates at 100 μm, and setting a shear rate in rotary shearing at 1 s$^{-1}$.

Examples of the low molecular binder include alcohols and ethers. Examples of the alcohols include terpene alcohols. Examples of the terpene alcohols include isobornyl cyclohexanol, citronellol, geraniol, nerol, carveol, and α-terpineol. Examples of the alcohols other than the terpene alcohols include pentanol, hexanol, heptanol, octanol, 1-decanol, ethylene glycol, diethylene glycol, propylene glycol, butylene glycol, and 2,4-diethyl-1,5-pentanediol. Examples of the ethers include alkylene glycol alkyl ethers. Examples of the alkylene glycol alkyl ethers include ethylene glycol butyl ether, diethylene glycol methyl ether, diethylene glycol ethyl ether, diethylene glycol butyl ether, diethylene glycol isobutyl ether, diethylene glycol hexyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol methyl ether, triethylene glycol dimethyl ether, triethylene glycol butyl methyl ether, propylene glycol propyl ether, dipropylene glycol methyl ether, dipropylene glycol ethyl ether, dipropylene glycol propyl ether, dipropylene glycol butyl methyl ether, dipropylene glycol dimethyl ether, tripropylene glycol methyl ether, and tripropylene glycol dimethyl ether. Examples of the ethers other than the alkylene glycol alkyl ethers include ethylene glycol ethyl ether acetate, ethylene glycol butyl ether acetate, diethylene glycol ethyl ether acetate, diethylene glycol butyl ether acetate, and dipropylene glycol methyl ether acetate.

In terms of the stability at normal temperature, the low molecular binder is preferably terpene alcohols, more preferably isobornyl cyclohexanol.

The content ratio of the metal particles in the metal particle-containing layer 2 is preferably 85 to 97 mass %, more preferably 88 to 96 mass %. The metal particle-containing layer 2, which includes metal particles of 85 mass % or more, has an advantage of making it possible to easily exert sufficient electrical conductivity after sintering. Also, the metal particle-containing layer 2, which includes metal particles of 97 mass % or less, has an advantage of making it possible to easily maintain the shape of the metal particle-containing layer 2.

The content ratio of the high molecular binder in the metal particle-containing layer 2 is preferably 0.1 to 10 mass %, more preferably 0.5 to 5 mass %. The metal particle-containing layer 2, which includes 0.1 mass % or more of the high molecular binder, has an advantage of making it possible to easily maintain the shape of the metal particle-containing layer 2. Also, the metal particle-containing layer 2, which includes 10 mass % or less of the high molecular binder, has an advantage of making it possible to reduce the residue component derived from the high molecular binder after sintering.

The content ratio of the low molecular binder in the metal particle-containing layer 2 is preferably 1 to 20 mass %, more preferably 2 to 15 mass %. The metal particle-containing layer 2, which includes 1 mass % or more of the low molecular binder, has an advantage of being excellent in transferability to the adherend. The metal particle-containing layer 2, which includes 20 mass % or less of the low molecular binder, has an advantage of making it possible to reduce the residue component derived from the low molecular binder after sintering.

The metal particle-containing layer 2 has a thickness of preferably 5 μm or more, more preferably 10 μm or more. The metal particle-containing layer 2 has a thickness of preferably 300 µm or less, more preferably 150 µm or less. The laminate 1 according to this embodiment, in which the metal particle-containing layer 2 has a thickness of 5 µm or more, has an advantage of making it possible to make the surface of the metal particle-containing layer 2 flat. Also, the laminate 1 according to this embodiment, in which the metal particle-containing layer 2 has a thickness of 30 µm or less, has an advantage of making it possible to minimize occurrence of cracking at the time of handling.

The metal particle-containing layer 2 has a shear fracture strength at 23° C. of preferably 2 to 40 MPa, more preferably 2 to 35 MPa, still more preferably 2 to 32 MPa. The laminate 1 according to this embodiment, in which the metal particle-containing layer 2 has a shear fracture strength at 23° C. of 2 MPa or more, has an advantage of making it possible to easily maintain the shape of the metal particle-containing layer 2. The laminate 1 according to this embodiment, in which the metal particle-containing layer 2 has a shear fracture strength at 23° C. of 40 MPa or less, has an advantage of being excellent in cuttability when transferred to the adherend.

The metal particle-containing layer 2 has a shear fracture strength at 100° C. of preferably 20 MPa or less, more preferably 9 MPa or less, still more preferably 7 MPa or less. The laminate 1 according to this embodiment, in which the metal particle-containing layer 2 has a shear fracture strength at 100° C. of 20 MPa or less, has an advantage of being excellent in cuttability when transferred to the adherend.

The shear fracture strength can be obtained by SAICAS method. The shear strength can be obtained using, for example, SAICAS (Surface And Interfacial Cutting Analysis System) which is an apparatus manufactured by Daipla Wintes Co., Ltd. Specifically, a shear fracture strength is obtained when the metal particle-containing layer 2 is cut by using a cutting blade (blade width: 1 nm, rake angle: 10°, clearance angle 10°) in a direction parallel to the surface of the metal particle-containing layer 2 at a speed of 10 µm/sec and in a direction perpendicular to the surface of the metal particle-containing layer 2 at a speed of 0.5 µm/sec, and the obtained shear strength is taken as a shear fracture strength.

The shear fracture strength can be adjusted by, for example, adjusting at least one of the mixing ratio of the high molecular binder and the mixing ratio of the low molecular binder or adjusting the viscoelasticity of the high molecular binder.

A minimum load on the metal particle-containing layer 2 which is reached during an unloading step in a load-displacement measurement by the nano-indentation method at 23° C. is preferably 30 to 100 µN, more preferably 32 to 80 µN, still more preferably 35 to 75 µN. The laminate 1 according to this embodiment, in which the minimum load at 23° C. on the metal particle-containing layer 2 is 30 µN or more, has an advantage of allowing the metal particle-containing layer 2 to be easily and tightly adhered to the adherend. The laminate 1 according to this embodiment, in which the minimum load at 23° C. on the metal particle-containing layer 2 is 100 µN or less, has an advantage that, in the case where the metal particle-containing layer 2 is covered with a release substrate, the release substrate can be easily released from the metal particle-containing layer 2 when needed.

The nano-indentation method is the nano-indentation method according to ISO14577 (instrumented indentation test). The load-displacement measurement by the nano-indentation method can be performed using a nano indenter (product name "Triboindenter" manufactured by Hysitron, Inc.). The load-displacement measurement by the nano-indentation method can be performed under the measurement conditions as follows:

Measurement mode: single indentation measurement
Indenter for use: Berkovich (trigonal pyramid) type diamond indenter
Maximum load (set value) reached during the load application step: 500 µN
Indentation speed of indenter in the load application step: 100 µN/sec The metal particle-containing layer 2 can be formed on the base sheet 3 in the following manner. First, a varnish is produced by mixing all the materials for the metal particle-containing layer 2 with a solvent. Next, the varnish is coated on the base sheet 3 to form a coating film, followed by drying the coating film (volatilizing the solvent in the coating film), to thereby form the metal particle-containing layer 2. Examples of the solvent include ketone and alcohol. Examples of the ketone include methyl ethyl ketone. Examples of the alcohol include methanol and ethanol.

In the laminate 1 according to this embodiment, the resin layer 31 (base sheet 3) is preferably a porous body while including at least one kind of resin selected from the group consisting of a polyolefin resin, a polyamide resin, and a fluorine resin. Also in the laminate 1 according to this embodiment, it is preferable that the at least one kind of resin selected from the group consisting of a polyolefin resin, a polyamide resin, and a fluorine resin be an ionomer resin. Further, in the laminate 1 according to this embodiment, it is preferable that the metal particle-containing layer 2 include a thermally-degradable high molecular binder as the high molecular binder.

A method for using the laminate according to this embodiment is a method for using the laminate 1 including the base sheet 3 and the metal particle-containing layer that is releasably laminated on the base sheet and including metal particles, the method including: separating a part of the metal particle-containing layer 2 by pressing the metal particle-containing layer 2 toward the base sheet 3; and releasing the separated part of the metal particle-containing layer 2 from the base sheet 3 to be adhered to an adherend. In the method for using the laminate according to this embodiment, the base sheet 3 has a contact surface 3a in contact with the metal particle-containing layer. In the method for using the laminate according to this embodiment, a Young's modulus at 23° C. of the base sheet, which is obtained by measuring the contact surface 3a using a nano-indentation method, is 0.01 to 10 GPa. In other words, it is important that the base sheet 3 has a Young's modulus at 23° C., which is obtained by measuring the contact surface 3a using a nano-indentation method, of 0.01 to 10 GPa. The Young's modulus can be measured by the same method as that explained in the description for the laminate 1 according to this embodiment.

In the method for using the laminate according to this embodiment, a part of the metal particle-containing layer 2 may be pressed by a press member that presses the metal particle-containing layer 2 toward the base sheet 3. In the method for using the laminate according to this embodiment, the adherend to which the cut-out part of the metal particle-containing layer 2 is adhered may be a die. In the method for using the laminate according to this embodiment, it is preferable that the base sheet 3 have a single layer structure or a multilayer structure, and include at least one resin layer 31, and it is preferable that the resin layer 31 have a surface that serves as the contact surface 3a, and a total thickness of the at least one resin layer 31 be 10 to 5,000 µm. In the method for using the laminate according to this embodiment, it is preferable that the content ratio of the metal particles in the metal particle-containing layer be 85 to 97 mass %. In the method for using the laminate according to this embodiment, it is preferable that the metal particles include at least one kind of metal selected from the group consisting of silver, copper, silver oxide, and copper oxide. In the method for using the laminate according to this embodiment, it is preferable that the shear fracture strength of the metal particle-containing layer 2 at 23° C. be 2 to 40 MPa and the minimum load on the metal particle-containing layer 2 which is reached during an unloading step in the load-displacement measurement by the nano-indentation method at 23° C. be 30 to 100 µN. The shear fracture strength at 23° C. and the minimum load on the metal particle-containing layer 2 which is reached during the unloading step in the load-displacement measurement by the nano-indentation method at 23° C. can be measured by the same method explained in the description for the laminate 1 according to this embodiment.

Next, the description will be given for a method for producing a semiconductor device according to this embodiment.

Figure 2:
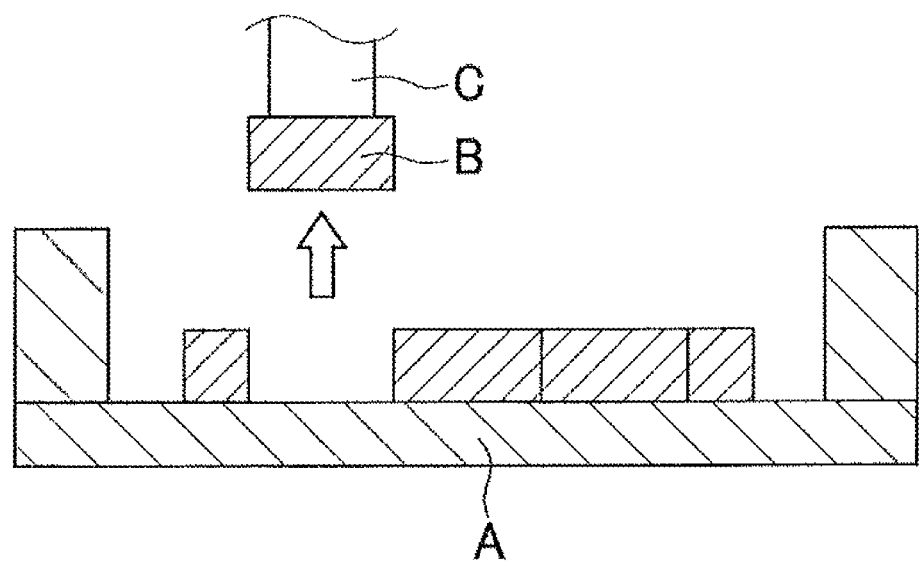
FIG. 2 is a schematic sectional view showing an appearance where a semiconductor chip B is picked up from a dicing tape A by a suction collet C.
Figure 3:
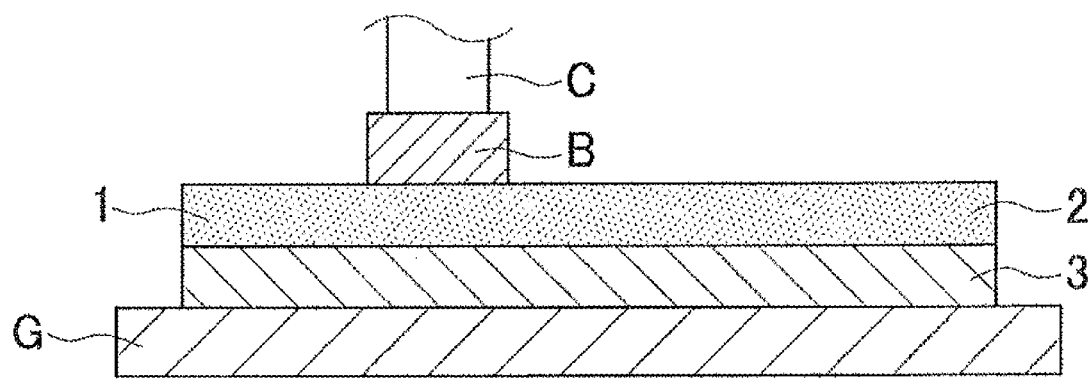
FIG. 3 is a schematic sectional view showing an appearance of a transfer step.
Figure 4:
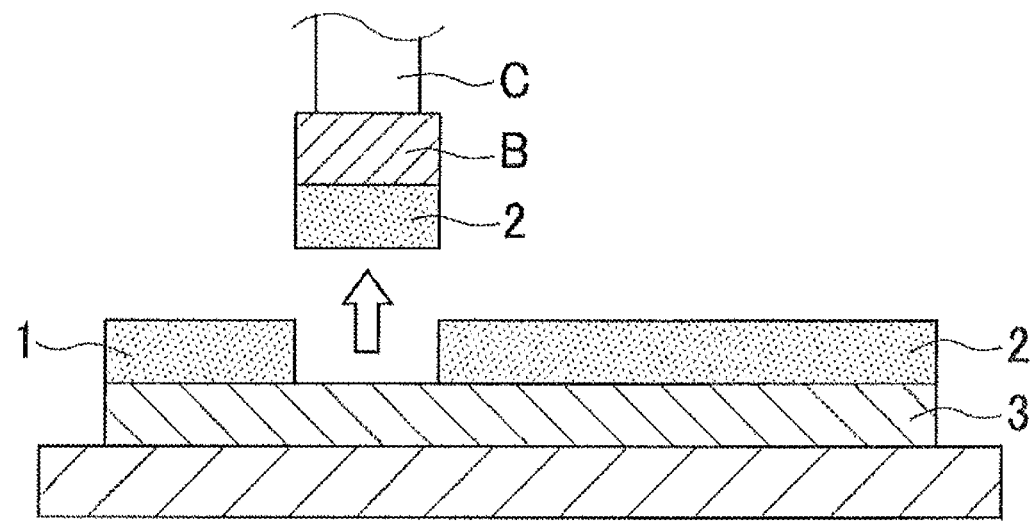
FIG. 4 is a schematic sectional view showing an appearance of a pick-up step.
Figure 5:
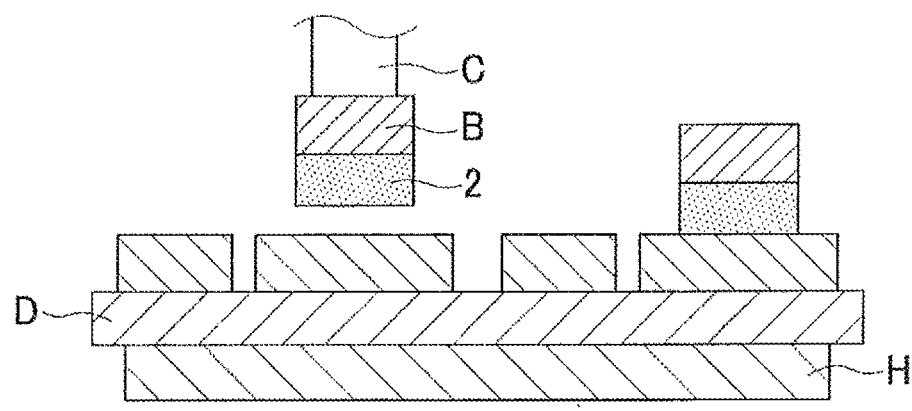
FIG. 5 is a schematic sectional view showing an appearance immediately before the semiconductor chip B with a metal particle-containing layer 2 is pressed to the lead frame D by the suction collet C.
Figure 6:
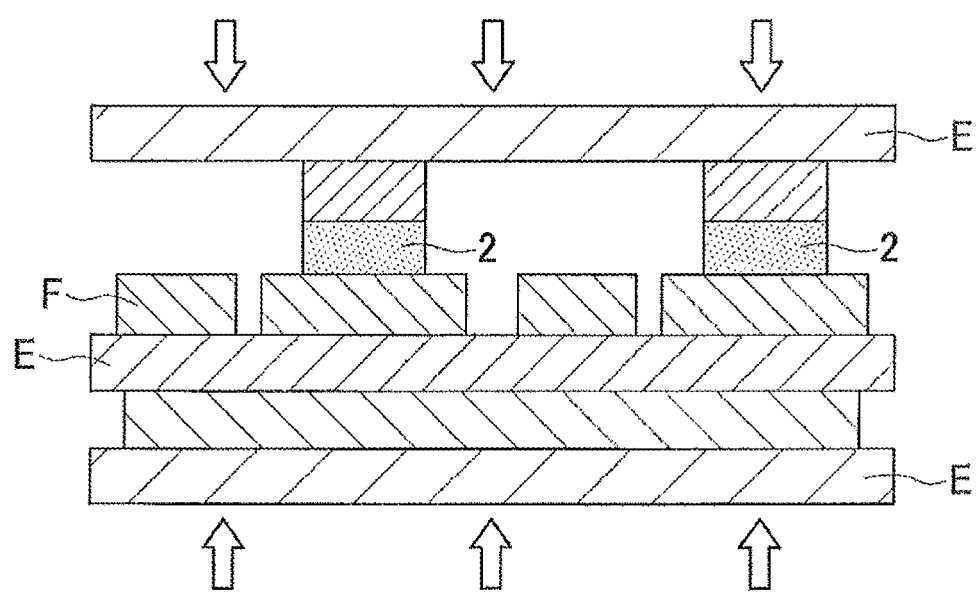
FIG. 6 is a schematic sectional view showing an appearance of a sintering step.

First, a semiconductor chip is obtained by cutting a wafer on a dicing tape. Next, a semiconductor chip B is picked up from a dicing tape A by a suction collet C as shown in FIG. 2. The semiconductor chip B generally has a rectangular shape in plan view, more specifically, has a square shape in plan view. The thickness of the semiconductor chip B is, for example, 10 to 500 µm, more specifically, 20 to 400 µm. The area of the semiconductor chip B in plan view is, for example, 0.01 to 1,000 mm$^2$, more specifically, 0.04 to 500 mm$^2$. Then, the laminate 1 is mounted on a stage G with the metal particle-containing layer 2 of the laminate 1 located upward as shown in FIG. 3. Then, the semiconductor chip B is pressed onto the metal particle-containing layer 2 of the laminate 1 by the suction collet C to cause a part of the metal particle-containing layer 2 to be transferred to the semiconductor chip B (transfer step). Thus, the semiconductor chip B with the metal particle-containing layer 2 can be obtained. The pressure to press the semiconductor chip B to the metal particle-containing layer 2 is preferably 0.01 to 10 MPa, more preferably 0.1 to 5 MPa. The temperature of the suction collet C or the stage G at the time of pressing the semiconductor chip B to the metal particle-containing layer 2 is preferably 40 to 150° C., more preferably 50 to 120° C. Next, as shown in FIG. 4, the semiconductor chip B with the metal particle-containing layer 2 is picked up from the laminate 1 by the suction collet C (pick-up step). Then, a lead frame D is mounted on a stage H as shown in FIG. 5. The semiconductor chip B with the metal particle-containing layer 2 is pressed from the metal particle-containing layer 2 side to the lead frame D by the suction collet C to cause the semiconductor chip B to be pressed and adhered to the lead frame D via the metal particle-containing layer 2. The pressure to press the semiconductor chip B with the metal particle-containing layer 2 from the metal particle-containing layer 2 side to the lead frame D is preferably 0.01 to 10 MPa, more preferably 0.1 to 5 MPa. The temperature of the suction collet C or the stage H at the time of pressing the semiconductor chip B with the metal particle-containing layer 2 from the metal particle-containing layer 2 side to the lead frame D is preferably 40 to 150° C., more preferably 50 to 120° C. The thickness of the lead frame D is, for example, 10 to 2,000 µm, more specifically, 400 to 1,500 µm. Next, as shown in FIG. 6, the metal particles of the metal particle-containing layer 2 are sintered by heating the metal particle-containing layer 2, while applying pressure thereto, using a pressure-heating device E (sintering step). Thus, a semiconductor device F is obtained. A bonding wire may be applied at any required part for bonding after the sintering step.

The laminate according to the present invention is not limited to the aforementioned embodiment. Further, the laminate according to the present invention is not limited also to the aforementioned operational effects. In the laminate according to the present invention, various modifications can be made without departing from the gist of the present invention.

For example, the metal particle-containing layer of the laminate according to this embodiment is a sinterable layer, but the metal particle-containing layer of the laminate according to the present invention may be a die bond film.

Further, the base sheet of the laminate according to this embodiment is the resin layer 31, but the base sheet may have a single layer structure or a multilayer structure in the present invention. The base sheet may include two or more resin layers. In the case where the base sheet includes two or more resin layers, the aforementioned total thickness of the resin layer means a total thickness of all the resin layers.

The matters disclosed herein include the following:

(1)

A laminate includes a base sheet and a metal particle-containing layer that is laminated on the base sheet and includes metal particles, wherein the base sheet has a contact surface in contact with the metal particle-containing layer, and a Young's modulus at 23° C. of the base sheet, which is obtained by measuring the contact surface using a nano-indentation method, is 0.01 to 10 GPa.

The base sheet has moderate cushioning properties because it has a Young's modulus of 0.01 to 10 GPa. As a result, a part of the metal particle-containing layer can be sufficiently transferred to the adherend when the adherend is pressed to the metal particle-containing layer due to the moderate cushioning properties of the base sheet. Therefore, the laminate can be excellent in transferability.

(2)

The laminate according to (1) above may be configured such that the base sheet has a single layer structure or a multilayer structure, and includes at least one resin layer, the at least one resin layer has a surface that serves as the contact surface, and a total thickness of the at least one resin layer is 10 to 5,000 µm.

According to such a configuration, an advantage of suppressing the material cost, while being excellent in handleability, can be obtained.

(3)

The laminate according to (1) or (2) above may be configured such that the metal particle-containing layer is laminated on the base sheet so as to be releasable from the base sheet, a part of the metal particle-containing layer is pressed toward the base sheet to be cut out for use, and the cut-out part of the metal particle-containing layer is released from the base sheet and adhered to an adherend.

(4)

The laminate according to any one of (1) to (3) above may be configured such that the content ratio of the metal particles in the metal particle-containing layer is 85 to 97 mass %.

According to such a configuration, there is provided an advantage of making it possible to easily maintain the shape of the metal particle-containing layer, while easily exerting sufficient electrical conductivity after sintering.

(5)

The laminate according to any one of (1) to (4) above may be configured such that the metal particles includes at least one kind of metal selected from the group consisting of silver, copper, silver oxide, and copper oxide.

According to such a configuration, the metal particle-containing layer can serve as a sintered layer to be firmly adhered to the adherend after sintering.

(6)

The laminate according to any one of (1) to (4) above may be configured such that the metal particle-containing layer has a shear fracture strength at 23° C. of 2 to 40 MPa, and a minimum load on the metal particle-containing layer which is reached during an unloading step in a load-displacement measurement by the nano-indentation method at 23° C. is 30 to 100 µN.

According to such a configuration, since the metal particle-containing layer has a shear fracture strength at 23° C. of 2 to 40 MPa, there is provided an advantage of making it possible to easily maintain the shape of the metal particle-containing layer, while being excellent in cuttability when transferred to the adherend. Further, since the minimum load which is reached during an unloading step in a load-displacement measurement by the nano-indentation method at 23° C. is 30 to 100 μN, there is provided an advantage that, in the case where the particle-containing layer is covered with a release substrate, the release substrate can be easily released from the metal particle-containing layer when needed, while the metal particle-containing layer can be easily and tightly adhered to the adherend.

EXAMPLES

Hereinafter, the present invention will be more specifically described with reference to the examples and the comparative examples. The following examples are provided for more specifically describing the present invention, and do not intend to limit the scope of the present invention.

Example 1

A varnish was prepared by, using a hybrid mixer (product name "HM-500" manufactured by Keyence Corporation), mixing the following materials with the following mixing ratios at a stirring mode of the hybrid mixer for three minutes.
Silver particles as metal particles: 59.76 parts by mass
Polycarbonate resin (product name "QPAC40" manufactured by Empower Materials, Inc., weight-average molecular weight: 150,000, solid form at normal temperature) as a high molecular binder (thermally-degradable high molecular binder): 0.87 parts by mass
Isobornyl cyclohexanol (product name: "TERSOLVE MTPH" manufactured by Nippon Terpene Chemicals, Inc., liquid form at normal temperature) as a low molecular binder (low boiling point binder): 0.87 parts by mass
Methyl ethyl ketone as a solvent: 35.91 parts by mass
The silver particles herein used were silver particles including first silver particles (median diameter (D50) on a volume basis: 60 nm manufactured by Dowa Electronics Materials Co., Ltd.) and second silver particles (median diameter (D50) on a volume basis: 1,100 nm manufactured by Mitsui Mining & Smelting Co., Ltd.) at a mass ratio of 9:1. Then, the obtained varnish was applied on a porous polyethylene sheet (porous PE sheet) (thickness: 300 μm) as the base sheet, followed by drying to form a metal particle-containing layer having a thickness of 54 μm. Thus, a laminate was obtained. The drying temperature was 110° C. and the drying time was 3 minutes. The content ratio of the metal particles in the metal particle-containing layer was 95 mass %.

Example 2

A laminate was obtained in the same manner as Example 1 except that a polytetrafluoroethylene sheet (PTFE sheet) (thickness: 300 μm) was used instead of the porous PE sheet as the base sheet.

Example 3

A laminate was obtained in the same manner as Example 1 except that a sheet (thickness: 250 μm) having two polyethylene films (PE film) (each thickness: 125 μm) laminated on each other was used instead of the porous PE sheet as the base sheet.

Example 4

A laminate was obtained in the same manner as Example 1 except that a sheet (thickness: 300 μm) having three polyethylene terephthalate films (PET film) (each thickness: 100 μm) laminated on each other was used instead of the porous PE sheet as the base sheet.

Comparative Example 1

A laminate was obtained in the same manner as Example 1 except that an adhesive sheet (thickness: 230 μm) having an adhesive layer (thickness: 20 μm) and a PE film (thickness: 210 μm) laminated on each other was used instead of the porous PE sheet as the base sheet.

Comparative Example 2

A laminate was obtained in the same manner as Example 1 except that a glass epoxy sheet (thickness: 350 μm) was used instead of the porous PE sheet as the base sheet.

Comparative Example 3

A laminate was obtained in the same manner as Example 1 except that a SUS sheet (thickness: 300 μm) was used instead of the porous PE sheet as the base sheet.

<Young's Modulus>

Before the varnish was applied to the base sheet, a Young's modulus of the base sheet at 23° C. was measured on the surface to be applied with the varnish (on the surface to come into contact with the metal particle-containing layer after the laminate was produced). The Young's modulus was measured by the method as aforementioned.

<Evaluation Test of Transferability>

FC 3000 W manufactured by Toray Engineering Co., Ltd. was use for the evaluation test of transferability. First, a load of 50N was applied for 5 minutes by allowing a collet heated at 90° C. to press a Si mirror chip (length: 5 mm, width: 5 mm, thickness: 200 μm), which has a surface entirely plated with silver, toward the metal particle-containing layer of the laminate of each of Examples and Comparative Examples on the plated surface side. Next, the Si mirror chip was separated from the laminate by the collet at a speed of 0.3 mm/sec to obtain a sample. Then, for each of those samples, measurement was made using VR-3000 G2 on an area R1 of the entire surface and an area R2 of the surface on which the metal particle-containing layer was transferred to obtain a ratio of the area R2 to the area R1 (R2/R1). The obtained ratio represented in percentage was taken as a transfer rate. In the measurement using VR-3000 G2, specifically, the sample was placed on a stage so that the surface on which the metal particle-containing layer was transferred was located upward, followed by capturing an image of the sample by a low magnification camera with magnification of 25 times. Then, an area A1 of a portion of the sample which protrudes by 50% or more of the thickness of the Si mirror chip from the stage (that is, protrudes by 100 μm or more from the stage) was measured, and this area A1 was taken as the area R1. Further, an area A2 of a portion of the sample which protrudes by 100% or more of the total of "the thickness of the Si mirror chip" and "a half the thickness of the metal particle-containing layer" (that is, protrudes by 154 μm or more from the stage) was measured, and this area A2 was taken as the area R2. The results are shown in Table 1. Each of the transfer rates shown in Table 1 below is a value obtained by arithmetically averaging the measured values obtained by performing the measurements for three times.

TABLE 1

|  | C. Ex. 1 | Ex. 1 | Ex. 2 | Ex. 3 | Ex. 4 | C. Ex. 2 | C. Ex. 3 |
| --- | --- | --- | --- | --- | --- | --- | --- |
| Young's modulus of base sheet (Gpa) | 0.0001 | 0.3 | 0.5 | 0.9 | 3.4 | 21 | 190 |
| Thickness of base sheet (μm) | 230 | 300 | 300 | 250 | 300 | 350 | 300 |
| Transfer rate (%) | 23.1 | 96.9 | 99.5 | 95.2 | 99.8 | 79.6 | 84.7 |

As shown in Table 1, the laminate of each of Examples had a transfer rate higher than the laminate of each of Comparative Examples. Therefore, a laminate excellent in transferability can be provided according to the present invention.

What is claimed:

1. A laminate comprising:
   a base sheet; and
   a metal particle-containing layer that is laminated on the base sheet and comprises metal particles, wherein
   the metal particle-containing layer comprises a high molecular binder having a weight-average molecular weight of 10,000 or more, a content ratio of the high molecular binder is 0.1 to 10 mass %,
   the metal particle-containing layer is laminated on the base sheet and is configured so as to be releasable from the base sheet,
   a part of the metal particle-containing layer is configured to press toward the base sheet to be cut out for use, and the cut-out part of the separated part of the metal particle-containing layer is configured to be released from the base sheet and adhered to an adherend,
   the metal particle-containing layer having an adhesion surface configured to be adhered to the adherend,
   the base sheet has a contact surface in contact with the metal particle-containing layer, and
   a Young's modulus at 23° C. of the base sheet, which is obtained by measuring the contact surface using a nano-indentation method, is 0.01 to 10 GPa.

2. The laminate according to claim 1, wherein
   the base sheet has a single layer structure or a multilayer structure, and comprises at least one resin layer,
   the at least one resin layer has a surface that serves as the contact surface, and
   a total thickness of the at least one resin layer is 10 to 5,000 μm.

3. The laminate according to claim 1, wherein
   the content ratio of the metal particles in the metal particle-containing layer is 85 to 97 mass %.

4. The laminate according to claim 1, wherein
   the metal particles comprises at least one kind of metal selected from the group consisting of silver, copper, silver oxide, and copper oxide.

5. The laminate according to claim 1, wherein
   the metal particle-containing layer has a shear fracture strength at 23° C. of 2 to 40 MPa, and
   a minimum load on the metal particle-containing layer which is reached during an unloading step in a load-displacement measurement by the nano-indentation method at 23° C. is 30 to 100 μN.

6. The laminate according to claim 1, wherein
   the high molecular binder comprises a polycarbonate resin.

* * * * *